Feb. 8, 1966 G. SPAKMAN ETAL 3,233,470

DECOUPLING APPARATUS FOR A PUSH-BUTTON TUNER

Filed April 13, 1964

INVENTORS

GEERT SPAKMAN

LUCAS W. M. SCHIJVEN

BY

Frank R. Trifari

AGENT

United States Patent Office 3,233,470
Patented Feb. 8, 1966

3,233,470
DECOUPLING APPARATUS FOR A PUSH-BUTTON TUNER

Geert Spakman and Lucas Wilhelmus Martinus Schijven, both of Emmasingel, Eindhoven, Netherlands, assignors to North American Philips Company, Inc., New York, N.Y., a corporation of Delaware Filed Apr. 13, 1964, Ser. No. 359,322
3 Claims. (Cl. 74—10.33)

The invention relates to a tuning device for radio receivers with a tuning knob for the continuous tuning and at least one adjustable push-button tuning mechanism for decoupling the tuning knob, and positioning a substantially semi-circular disc which is rotatably mounted on a substantially strip-shaped tuning slide operated by the push-button. The disc, in the chosen position with respect to the tuning slide, can be locked in the chosen position by means of a clamping lever journalled on said slide and extending in the longitudinal direction thereof which clamping lever swings out laterally on locking. An inclined portion of said clamping lever cooperates with a member freely slidable on the tuning slide to clamp the semicircular disc in the chosen angular position with the tuning slide. The disc is unlocked by pulling out the push-button, thus withdrawing the freely slidable member. During a subsequent depression of the push-button the tuning slide is pushed in and then the pivotal disc on the freely slidable member is set and locked in position without the tuning knob being decoupled.

In a known tuning device of this type (U.S. Patent 2,494,008) the decoupling of the tuning knob and the clamping of the disc in the correct angular position at the correct instant is achieved by means of a separate element which is under spring pressure and is provided on the tuning slide.

According to the invention a simplification of such a device is obtained in that the end of the clamping lever, swung out laterally in the locked position, itself operates as the decoupling device for the tuning knob. So in this case no separate member for decoupling the tuning knob is required.

In order that the invention may readily be carried into effect, an example thereof will now be described more fully, by way of example, with reference to the accompanying drawing, in which.

Figure 1:
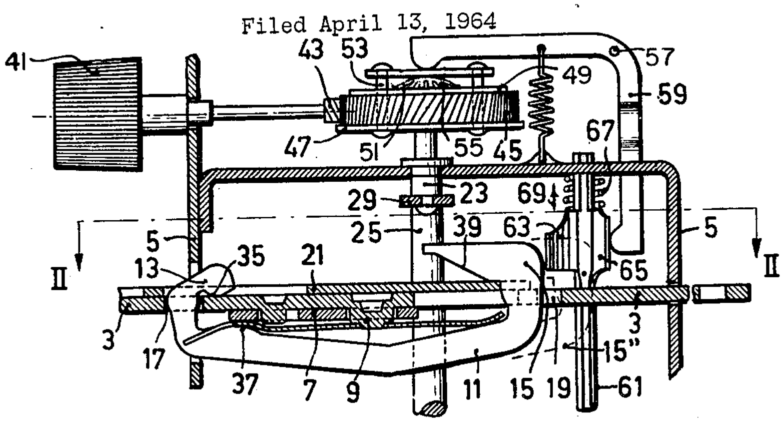
FIG. 1 shows a bottom view partly in cross-section of an embodiment of the invention.

The figures of the drawing show the parts of a tuning device for a radio receiver essential to the invention which include a plurality of substantially identical strip-shaped tuning slides 3 (only one of them is shown) operated by a push-button 1. The slide is slidably journalled in a common frame 5 which may be of the normal construction and which is shown only in part. Each of the tuning slides 3 has a substantially semicircular disc 7 rotatably mounted around a short pivot 9 formed on the slide 3 by depression. The disc 7 may be locked in a chosen angular position with respect to the tuning slide 3 by means of a clamping lever 11 journalled on the said slide and extending in the longitudinal direction thereof. Said lever 11 has the shape of a U with two short inwardly bent limbs 13 and 15 which extend through apertures 17 and 19 respectively in the strip-shaped tuning slide 3 (see FIGURE 1).

The clamping lever 11, 13, 15 cooperates in a manner to be described below with a strip-shaped member 21 mounted on the tuning slide 3 and freely movable with respect to slide 3 in order to clamp the edge of the semicircular disc 7 between the lever 11 and the tuning slide 3. The disc 7 which is fixed in its position in this manner cooperates in normal manner with a known frame-shaped adjusting member which is rotatable around a shaft 23 and consists of two rods 25 and 27 extending in parallel with the shaft 23 and two horizontal strips 29 and 31 which connect the ends hereof. On depressing the push-button 1 together with the tuning slide 3 against the force of a spring (not shown), the substantially straight edge of the disc 7, moved in a direction to the right in the figures, becomes located in the depressed or pushed-in position 7', shown in broken lines in FIG. 2, against the rods 25 and 27. The frame 25, 27, 29, 31 thereby assuming a position corresponding to the position of the disc 7 thereby setting, for example through a steel wire 33, a tuning member of the receiver, for example a sliding core (not shown) connected to the wire 33, in a predetermined desired position.

Figure 3:
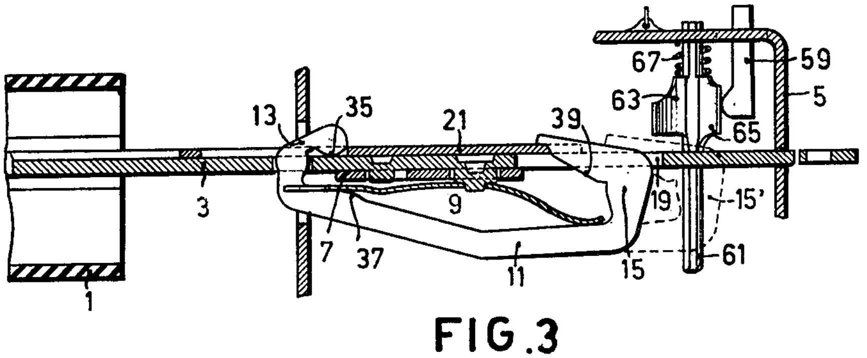
FIG. 3 shows a bottom view similar to FIG. 1 of the same device in another operative position.

The disc 7 may be set in another position, after having been released, which is effected in a manner to be explained below, by pulling on the push-button to withdraw the freely slidable member 21. FIGURE 3 illustrates this unlocked position in which, as may be seen from a comparison of FIGURES 1 and 3, the U-shaped clamping lever 11, 13, 15 is swung clockwise.

The fulcrum 35 of the clamping lever is located on the inwardly bent limb 13 of the lever 11, while the point of pressure 37, that is to say the point 37 where the lever 11 presses against the edge of the disc 7 and holds it clamped against the tuning slide 3. Point 37 is located on the bottom portion of lever 11. The other limb 15 of the U-shaped clamping lever has an inclined portion 39, which, as may be seen from a comparison of FIGURES 1 and 3, cooperates with the freely slidable strip-shaped member 21 to move lever 11 counterclockwise and then acting as a stop so that both slides 3 and 21 move as a unit upon further movement of slide 21 to the right in FIG. 1. The adjacent ends of the tuning slide 3 and of the slidable member 21 are connected in the push-button 1 in a manner such that the member 21 with respect to the slide 3 is freely slidable by means of the button 1, so that by pulling out this button member 21 may be unlocked from slide 3, as shown in FIG. 3. The device described above is the subject matter of the simultaneously filed application Serial No. 359,289, filed April 13, 1964.

The combination according to this invention will now be described.

Figure 2:
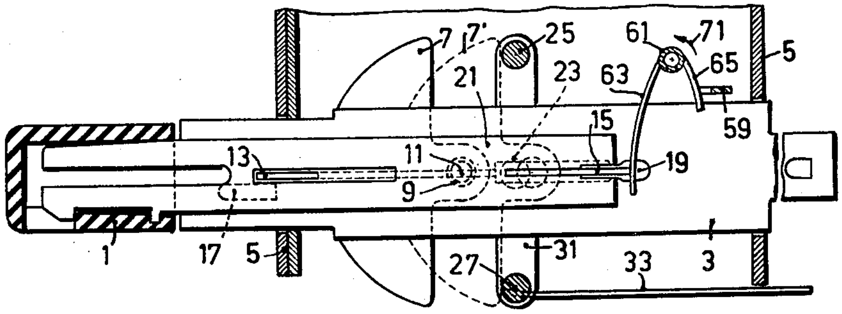
FIG. 2 is a lateral view taken on line II—II of FIG. 1, also partly in cross-section.

FIGURES 1 and 2 illustrate the normal operative condition of the tuning device in which condition, by a preceding depression of the push-button 1, the strip-shaped member 21 is moved to the right with respect to the tuning slide 3 to place lever 11 in the position shown in FIG. 1 as compared with the position shown in FIGURE 3. As a result of its position (FIG. 1), the limb portion 15 of the clamping lever 11 is laterally pivoted extended through the aperture 19. Because the fulcrum 35 and the point of pressure 37 of the clamping lever are located close to one another in the longitudinal direction thereof, the lever 11 exerts a considerable clamping force at the point of pressure 37 on the edge of the disc 7.

In order to be able to tune the receiver continuously, a rotatable tuning button 41 is provided which is coupled by means of a worm 43 to a wormwheel 45 which is freely rotatably on the shaft 23. This worm-wheel is coupled to the shaft 23 through a friction coupling consisting of two coupling plates 47 and 49 provided on either side of the wormwheel which plates are kept pressed against the wormwheel 45 by a cup spring 55 and associated pressure plate 51 and three or more drawbars 53. On further depression the push-button 1 (to the right in FIG. 1), the coupling just described is automatically released by means of a decoupling device consisting of a bell crank lever 59 rotatable around the shaft 57 and of a transmission element substantially consisting of a shaft portion 61 and two lug-shaped projections 63 and 65 formed thereon. The transmission element 61, 63, 65 is rotatably mounted in the frame 5 and slidable against the action of a spring 67 in the direction of the arrow 69. If the tuning device 3, 7, 11, 21 positioned as shown in FIG. 1 is further depressed, i.e. moved to the right, the portion 15 of the clamping lever, forces the end of the lug-shaped projection 63 in a backward or counterclockwise direction, as a result of which the shaft 61 obtains a rotary motion in the direction of the arrow 71. The lug-shaped projection 65 (FIG. 2) forces the engaging end of the bell crank lever 59 in a backward direction, which movement is transmitted by the bell crank lever 59 to the bridge plate 51 thereby causing, in known manner, the coupling between the wormwheel 45 of the shaft 23 to be released, so that the movement of the frame 25, 27, 29, 31 to the desired radio station can take place without difficulty by the disc 7.

If the disc 7 is to be set in another position corresponding to another radio station, the tuning device 3, 7, 11, 21 is set in the unlocked position shown in FIGURE 3 by pulling on the push-button 1. After the frame 25, 27, 29, 31 operating the tuning members has been tuned to the new radio station by means of the tuning knob 41, the push-button 1 is again depressed (moved to the right), in which, owing to the friction between the tuning slide 3 and the member 21, substantially caused by the inclined portion 39 of the clamping lever, these two parts initially move to the right collectively in the position shown in FIGURE 3. The limb 15 of the U-shaped clamping lever assumes the position 15' shown in dotted lines, during which movement, as may be seen from FIGURE 3, the lug 63 is not touched and the shaft 23 consequently is not decoupled. This is desired since the frame 25, 27, 29, 31 now in turn has to adjust the disc 7 and it consequently is of importance that during this adjusting process the frame 25, 27, 29, 31 remains fixed as much as possible and does not vary its position. When the desired position of the disc 7 is reached, it is locked by further depressing the tuning button 1 by means of the clamping lever 11, 13, 15 (see FIGURE 1). In this case the end 15 of the clamping lever assumes the position 15'' shown in dotted lines in FIGURE 1 and it is clear that during this movement the lug 63 is engaged from below and is moved axially upwardly against the pressure of the spring 67 in the direction of the arrow 69. As may be seen from FIGURE 1, no decoupling of tuning knob 41 and wheel 45 takes place so that the adjusting frame 25, 27, 29, 31 remains fixed during the process. Only after release of the push-button 1 is the position shown in FIGURE 2 reattained, wherein the decoupling device for the continuous tuner knob is again disconnected when the push-button 1 is depressed.

What is claimed is:

1. In a radio having an adjustable push-button tuner and a continuous tuner, an improved decoupling apparatus comprising in combination a generally U-shaped clamping lever, a push-button slide, a strip member carried by said slide, limb means at one end of said lever for pivotally journaling said lever on said slide, a limb means at the other end of said lever having an inclined surface cooperable with said strip member for pivoting said locking lever into an elevated position relative to said slide, said lever straddling a tuning disc pivotally attached to said slide and clamping said tuning disc in said elevated position; a continuous tuner means including a friction coupling, a bell crank uever having one end connected with said friction coupling, and a rotatable transmission element operatively connected with the other end of said bell crank lever, said rotatable transmission element being positioned in the path of said U-shaped lever in said elevated position for releasing said friction coupling, said transmission element being movable in a direction normal to said path whereby in a fully depressed position of said push button slide said U-shaped lever may be moved by said strip member into said elevated position without decoupling said continuous tuner.

2. Decoupling apparatus according to claim 4, wherein said transmission element comprises a shaft, said shaft having a pair of radially projecting lugs, one engaging said bell crank lever, and the other engageable by said locking lever in said elevated position.

3. A decoupling apparatus for a push-button radio having a slide member operated by said push-button, a tuning disc rotatably mounted on said slide and a locking lever journaled on said slide for clamping said disc to said slide in one position of said locking lever; comprising a continuous tuner means including a friction coupling, a decoupling lever having one end connected with said friction coupling, a rotatable shaft having a pair of lug shaped projections thereon, one of said pair of lugs being in the path of movement of said locking lever in said one position thereof, the other of said pair of lugs being in operative connection with the other end of said decoupling lever for releasing said friction coupling, and yieldable means connected with said shaft for movement of said shaft in a plane substantially normal to said path of said locking lever.

References Cited by the Examiner

UNITED STATES PATENTS 2,863,043 12/1958 Schmidt et al. ---- 74—10.33 X
2,996,925 8/1961 Stamm ------------ 74—10.33

MILTON KAUFMAN, *Primary Examiner.*